United States Patent [19]

Tokita et al.

[11] Patent Number: 5,484,490
[45] Date of Patent: Jan. 16, 1996

[54] P-TYPE THERMOELECTRIC MATERIAL

[75] Inventors: Shigeki Tokita, Okazaki; Makoto Okabayashi, Anjo; Takashi Amano, Nagoya; Isao Nishida, Tokyo, all of Japan

[73] Assignees: Technova Inc.; National Research Institute for Metals, both of Tokyo, Japan

[21] Appl. No.: 200,321

[22] Filed: Feb. 23, 1994

[30] Foreign Application Priority Data

Feb. 23, 1993 [JP] Japan .................................. 5-033192
Feb. 10, 1994 [JP] Japan .................................. 6-16630

[51] Int. Cl.$^6$ ................................................ H01L 35/14
[52] U.S. Cl. ................ 136/236.1; 136/201; 136/238; 136/239; 419/29; 419/45; 419/46; 419/53
[58] Field of Search .......................... 136/236.1, 238, 136/239, 201; 75/246; 419/26, 29, 32, 34, 45, 46, 53, 60

[56] References Cited

U.S. PATENT DOCUMENTS

| | | | |
|---|---|---|---|
| 2,988,806 | 6/1961 | Adams et al. | 29/182.5 |
| 3,182,391 | 5/1965 | Charland et al. | 29/420.5 |
| 4,275,259 | 6/1981 | Yamamoto et al. | 136/209 |
| 4,589,918 | 5/1986 | Nishida et al. | 75/244 |
| 5,009,717 | 4/1991 | Komabayashi et al. | 136/201 |
| 5,057,161 | 10/1991 | Komabayashi et al. | 136/240 |
| 5,069,868 | 12/1991 | Tokia et al. | 419/23 |
| 5,252,119 | 10/1993 | Nishida et al. | 75/236 |

FOREIGN PATENT DOCUMENTS

| | | | |
|---|---|---|---|
| 2014413 | 10/1971 | Germany | 136/239 |
| 60-43881 | 3/1985 | Japan . | |
| 60-43882 | 3/1985 | Japan | 136/200 |
| 1118184 | 6/1968 | United Kingdom | 136/239 |

*Primary Examiner*—Donald P. Walsh
*Assistant Examiner*—Chrisman D. Carroll
*Attorney, Agent, or Firm*—Jacobson, Price, Holman & Stern

[57] ABSTRACT

A P-type thermoelectric material consists essentially of iron disilicide, metallic manganese and metallic aluminium dissolved in or alloyed with the iron disilicide, and silicon oxide and/or aluminum oxide present in the iron disilicide. The manganese is contained in an amount of from 1.67 to 4.1 atomic % with respect to a sum of atoms of iron and silicon constituting the iron disilicide, the metallic manganese and the metallic aluminum taken as 100 atomic %, and the metallic aluminum contained in an amount of from 1.33 to 3.33 atomic % with respect thereto, and a sum of the metallic manganese and the metallic aluminum in an amount of from 4.0 to 5.34 atomic % with respect thereto. The P-type thermoelectric material having such a composition produces a thermoelectromotive force equal to or greater than those of the conventional P-type thermoelectric materials comprised of iron disilicide, and it exhibits a mean resistivity equal to or smaller than that of the N-type thermoelectric material. Hence, a thermocouple including the P-type thermoelectric material and the N-type thermoelectric material can be remarkably enhanced in the performance as a whole.

20 Claims, 9 Drawing Sheets

○—○ : TEST SPECIMEN GROUP A (Al CONTENT: 0.67%)
△---△ : TEST SPECIMEN GROUP B (Al CONTENT: 1.33%)
□--□ : TEST SPECIMEN GROUP C (Al CONTENT: 2.00%)
◇--◇ : TEST SPECIMEN GROUP D (Al CONTENT: 2.67%)
☆ : TEST SPECIMEN GROUP E (Al CONTENT: 1.67%)
◆ : TEST SPECIMEN GROUP F (Al CONTENT: 2.33%)
❋ : TEST SPECIMEN GROUP G (Al CONTENT: 3.33%)

P-TYPE THERMOELECTRIC MATERIAL

BACKGROUND OF THE INVENTION

1. Field of the Invention

The present invention relates to a thermoelectric material. More particularly, it relates to a P-type thermoelectric material comprising iron disilicide which can produce a large electric power, and which exhibits a small mean resistivity.

2. Description of Related Art

In Japanese Examined Patent Publication (KOKOKU) No. 60-43,881, discloses a P-type thermoelectric material which can produce a large amount of electric power. The P-type thermoelectric material comprises iron disilicide, which contains manganese (Mn), in atomic % (hereinafter % means atomic % unless otherwise specified), in an amount of from 0.5 to less than 1.67%, and aluminum (Al), wherein the combined amount of manganese and aluminum is from 2.0 to less than 4.7% in total. This patent application was issued as registered Japanese Patent No. 1,599,140.

When the P-type thermoelectric material, disclosed in Japanese Examined Patent Publication (KOKOKU) No. 60-43,881 and comprised of the iron disilicide, contains, in atomic %, Mn in an amount of 0.6%, Al in an amount of 2.7% and accordingly Mn and Al in an amount of 3.3% in total, it produces a thermoelectromotive Force of 183 mV and exhibits a mean resistivity of 0.009 ohm-cm under a temperature difference of 800° C. Consequently, the P-type thermoelectric material can produce an effective maximum power of 0.96 Wcm/cm$^2$.

The P-type thermoelectric material is usually used together with an N-type thermoelectric material as a pair. The N-type thermoelectric material used together with the P-type thermoelectric material as a pair, for instance, an iron disilicide N-type thermoelectric material exhibits a mean resistivity of 0.0053 ohm-cm under a temperature difference of 800° C. The resistivity is smaller by a 41.1% than that of P-type thermoelectric material comprised of iron disilicide. Accordingly, the electric power produced by the iron disilicide N-type thermoelectric material is larger than the electric power produced by the P-type thermoelectric material comprised of iron disilicide. However, the N-type thermoelectric material and the P-type thermoelectric material are normally used in a pair as a unit. Consequently, the original mean resistivity of the unit as a whole is larger than the inherent resistivity of the iron disilicide N-type thermoelectric material. As a result, the inherent high capacity of the iron disilicide N-type thermoelectric material is canceled, and thereby there arises a problem that the inherent high capacity cannot be fully utilized.

SUMMARY OF THE INVENTION

It is therefore an object of the present invention to provide a P-type thermoelectric material which produces a thermoelectromotive force equal to or greater than those of conventional P-type thermoelectric materials comprised of iron disilicide, and which exhibits a mean resistivity equal to or smaller than that of N-type iron disilicide thermoelectric materials.

The inventors of the present invention investigated the relationships between the contents of Mn and Al, which were contained in P-type thermoelectric materials comprised of iron disilicide, and the thermoelectromotive forces as well as the mean resistivities, which were exhibited by P-type thermoelectric materials comprised of iron disilicide containing Mn and Al. As a result, when the Mn content, the Al content and the sum of the Mn and Al contents were controlled in predetermined ranges, they found that a P-type thermoelectric material could be prepared which could produce s thermoelectromotive force equal to or greater than that of conventional P-type thermoelectric materials comprised of iron disilicide, and which could exhibit a mean resistivity equal to or smaller than that of iron disilicide N-type thermoelectric material. They thus completed the present invention.

A P-type thermoelectric material according to the present invention consists essentially of: iron disilicide; manganese; and aluminum; the manganese and the aluminum dissolved in or alloyed with the iron disilicide; the manganese contained in an amount of from 1.67 to 4.1 atomic % with respect to a sum of [atoms of iron and silicon (constituting the iron disilicide), manganese atoms and aluminum taken as 100 atomic %; the aluminum atoms] contained in an amount of from 1.33 to 3.33 atomic % with respect thereto; and a sum of the manganese and the aluminum in an amount of from 4.0 to 5.34 atomic % with respect thereto.

The reasons will be hereinafter described why, in the present P-type thermoelectric material, the Mn content, the Al content and the sum of the Mn content and the Al content are controlled in the aforementioned ranges.

The present P-type thermoelectric material contains Mn in an amount of from 1.67 to 4.1%. When the amount of Mn is less than 1.67%, the resulting P-type thermoelectric materials exhibit a mean resistivity in a magnitude equal to that of conventional P-type thermoelectric materials. As a result, when such P-type thermoelectric materials and the N-type thermoelectric material are used in a pair as a unit, the mean resistivity of the unit as a whole is larger than the inherent resistivity of the N-type thermoelectric material. Hence, the problem associated with conventional P-type thermoelectric materials cannot be solved; namely: the inherent high capacity of the iron disilicide N-type thermoelectric material cannot be fully utilized. On the other hand, when the amount of Mn is more than 4.1%, such Mn content might considerably reduce the effective maximum power of the resulting P-type thermoelectric materials.

Further, the present P-type thermoelectric material contains Al in the amount of from 1.33 to 3.33%. When it contains Al in an amount of less than 1.33%, the resulting P-type thermoelectric materials might exhibit a small effective maximum power unpreferably. On the other hand, when it contains Al in an amount of more than 3.33%, such Al contents might considerably deteriorate the effective maximum power of the resulting P-type thermoelectric materials unpreferably.

Furthermore, in the present P-type thermoelectric material, the sum of the Mn content and the Al content is controlled in the amount of from 4.0 to 5.34%. When the sum of the Mn content and the Al content is less than 4.0%, the resulting P-type thermoelectric materials exhibit a mean resistivity in a magnitude equal to or greater than that of the conventional P-type thermoelectric materials. As a result, when such P-type thermoelectric materials and the N-type thermoelectric material are used in a pair as a unit, the problem associated with conventional P-type thermoelectric materials cannot be solved; namely: the inherent high capacity of the iron disilicide N-type thermoelectric material cannot be fully utilized. On the other hand, when the sum of the Mn content and the Al content is more than 5.34%, the resulting P-type thermoelectric materials containing Mn and Al in such sums might produce a considerable reduction in effective maximum power.

Based on the aforementioned reasons, in the present P-type thermoelectric material, the Mn content is controlled in the amount of from 1.67 to 4.1%, the Al content is controlled in the amount of from 1.33 to 3.33%, and the sum of the Mn content and the Al content is controlled in the amount of 4.0 to 5.34%. It is further preferred that the Mn content is controlled in an amount of from 1.67 to 3.33%, and that the Al content is controlled in an amount of from 1.67 to 2.67%. In the present P-type thermoelectric material comprised of the iron disilicide thus containing Mn and Al, it is believed that the Mn and Al are contained in the iron disilicide in a form of alloys or solid solutions. In addition, it is necessary that the iron disilicide be beta-iron disilicide (semiconductor phase).

Heretofore, all of the materials constituting the present P-type thermoelectric material have been described as the material without involving the oxides (hereinafter they are called the metallic phases). However, during the production process of the present P-type thermoelectric material and during the service thereof for generating an electric power, the elements constituting the present P-type thermoelectric combine with oxygen in the atmosphere, and they partially turn into their oxides. Consequently, the oxides reduce the contents of the elements in the metallic phases. In many cases, the presence of oxygen results in the deterioration of the effective maximum power of thermoelectric material. However, when the composition of the Al or Si in the metallic phase is greater than the optimum composition, the presence of oxygen results in increment of the effective maximum power. Thus, the presence of oxygen does not necessarily affect thermoelectric material adversely.

In the present invention, the compositions of all of the four elements, e.g., Fe, Mn, Si and Al, are specified as being present in the metallic phases. When the Fe, Mn, Si and Al are partially oxidized, all of the nonoxidized Fe, Mn, Si and Al (in the metallic phases) are taken as 100%, and the compositions are determined. At present, the oxygen content in the resulting present P-type thermoelectric material is not evaluated. Therefore, in the present specification, it is only possible to qualitatively explain the influences resulting from the presence of oxygen.

The present P-type thermoelectric material can be produced by first preparing a metallic powder containing iron, silicon, manganese and aluminum in predetermined compositions, and then by forming and sintering the resulting metallic powder. The metallic powder can be ground to a fine powder by pulverizing or atomizing an alloy having a predetermined composition. Further, the metallic powder can be prepared by mechanically alloying fine powders of metallic iron, metallic silicon, metallic manganese and metallic aluminum. Assuming that no oxides are present, the metallic powder is comprised, taking the sum of the atoms of the iron, silicon, manganese and aluminum as 100%, of the manganese in an amount of from 1.67 to 4.1%, the aluminum in an amount of from 1.33 to 3.33%, and a sum of the manganese and the aluminum in an amount of from 4.0 to 5.34%. The iron and silicon constitute beta-phase iron disilicide which is expressed by a chemical formula, $FeSi_2$, representatively.

The aforementioned sintering of the metallic powder can be carried out by an ordinary sintering process, such as hot pressing, atmospheric sintering, plasma sintering and the like. It is preferred that the sintering is carried out in an inert gas atmosphere or vacuum so as not to involve the other elements such as oxygen and the like during the sintering.

It is necessary to carry out the sintering at a relatively high temperature. When the sintering is carried out at elevated temperatures, the iron and silicon are turned into a eutectic alloy which is comprised of alpha-phase iron disilicide represented by $Fe_2Si_5$ and epsilon-phase iron disilicide represented by FeSi. Therefore, it is usually necessary to carry out a heat treatment in order to make the alpha- and epsilon-phase into the beta-phase (semiconductor) after the sintering (hereinafter referred to as a "beta-heat treatment"). In the production process of the present P-type thermoelectric material, the beta-heat treatment is carried out in a temperature range of from 700° to 830°0 C., preferably at around 760° C., thereby obtaining the beta-phase (or semiconductor-phase) iron disilicide. If oxygen is present during production or service, it is preferred that the metallic powder contains the elements which might possibly be oxidized by excessive amounts of oxygen.

As having been described so far, the present P-type thermoelectric material contains the iron disilicide, and the Mn and Al contained in the iron disilicide in optimum amounts. Namely, it contains Mn in the amount of from 1.67 to 4.1%, Al in the amount of 1.33 to 3.33%, and the sum of Mn and Al in the amount of 4.0 to 5.34%. As a result, it produces a thermoelectromotive force equal to or greater than those of the conventional P-type thermoelectric materials comprised of iron disilicide, and it exhibits a mean resistivity equal to or smaller than that of the N-type thermoelectric material, for example, the iron disilicide N-type thermoelectric material.

Hence, when the present P-type thermoelectric material and the N-type thermoelectric material are used in a pair as a unit, the unit as a whole exhibits a mean resistivity equal to that of the N-type thermoelectric material. Namely, the inherent high capacities of the present P-type thermoelectric material and the N-type thermoelectric material are little canceled each other, thereby enabling to constitute a thermocouple which fully utilizes the high capacities. Consequently, the thermocouple can be remarkably enhanced in the performance as a whole.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained by reference to the specific preferred embodiments which are provided herein for purposes of illustration only and are not intended to limit the scope of the appended claims.

First Preferred Embodiment

First of all, an alloy ingot was prepared, and it was comprised of iron disilicide containing Mn and Al in an amount of 4.0% and 1.33% respectively. Namely, in the alloy ingot comprised of the iron disilicide, a sum of the Mn content and the Al content was 5.33%. When the iron disilicide is expressed with a composition formula, $Fe_{1-x}Mn_xSi_{2-y}Al_y$, in which the quantities of the constituent elements are expressed in number of moles, it can be expressed with $Fe_{0.88}Mn_{0.12}Si_{1.96}Al_{0.04}$. The composition of the alloy ingot and the composition formula is set forth in a line designated with "Ex. 1" of Table 1 below.

The alloy ingot comprised of the iron disilicide having the aforementioned composition was pulverized with a mortar made of iron to a powder having an average particle diameter of 0.5 mm. The resulting powder was further pulverized in a centrifugal mill to a fine powder in air. The fine powder had an average particle diameter of from 2 to 3 micrometers in air.

Then, the resulting fine powder was placed in a vacuum of $6.65 \times 10^{-2}$ Pa, and it was heated at a temperature of 1,100° C. for 30 minutes while applying a pressure of 24.5 MPa thereto. By this sintering, a disk-shaped sintered body was prepared, and it had a diameter of 60 mm and s thickness of 5 mm.

A test specimen was cut out from the resulting disk-shaped sintered body, and it had a rectangular parallelepiped shape having a length of 5 mm, a width of 6 mm and a height of 40 mm. It was then placed in a vacuum of 1.33 MPa, and it was heated at a temperature of 1,130° C. for 8 hours. Through this process, it was subjected to a homogenizing heat treatment.

Finally, the test specimen subjected to the homogenizing heat treatment was further heated at a temperature of 760° C. for 100 hours in air, and it was cooled in furnace. Through this process, it was subjected to the beta-heat treatment. By thus carrying out a series of processes, a P-type thermoelectric material according to the First Preferred Embodiment was produced which was sintered by hot pressing.

The hot-pressing-sintered P-type thermoelectric material according to the First Preferred Embodiment thus produced was examined for the thermoelectric properties. For instance, it was measured, under a temperature difference of 800° C. for the thermoelectromotive force "E" and the means resistivity "ρ" by direct current method, thereby calculating the effective maximum power "P". The results of the measurements are set forth in a line designated with "Ex. 1" of Table 2 below together with the composition of the P-type thermoelectric material according to the First Preferred Embodiment.

Figure 1:
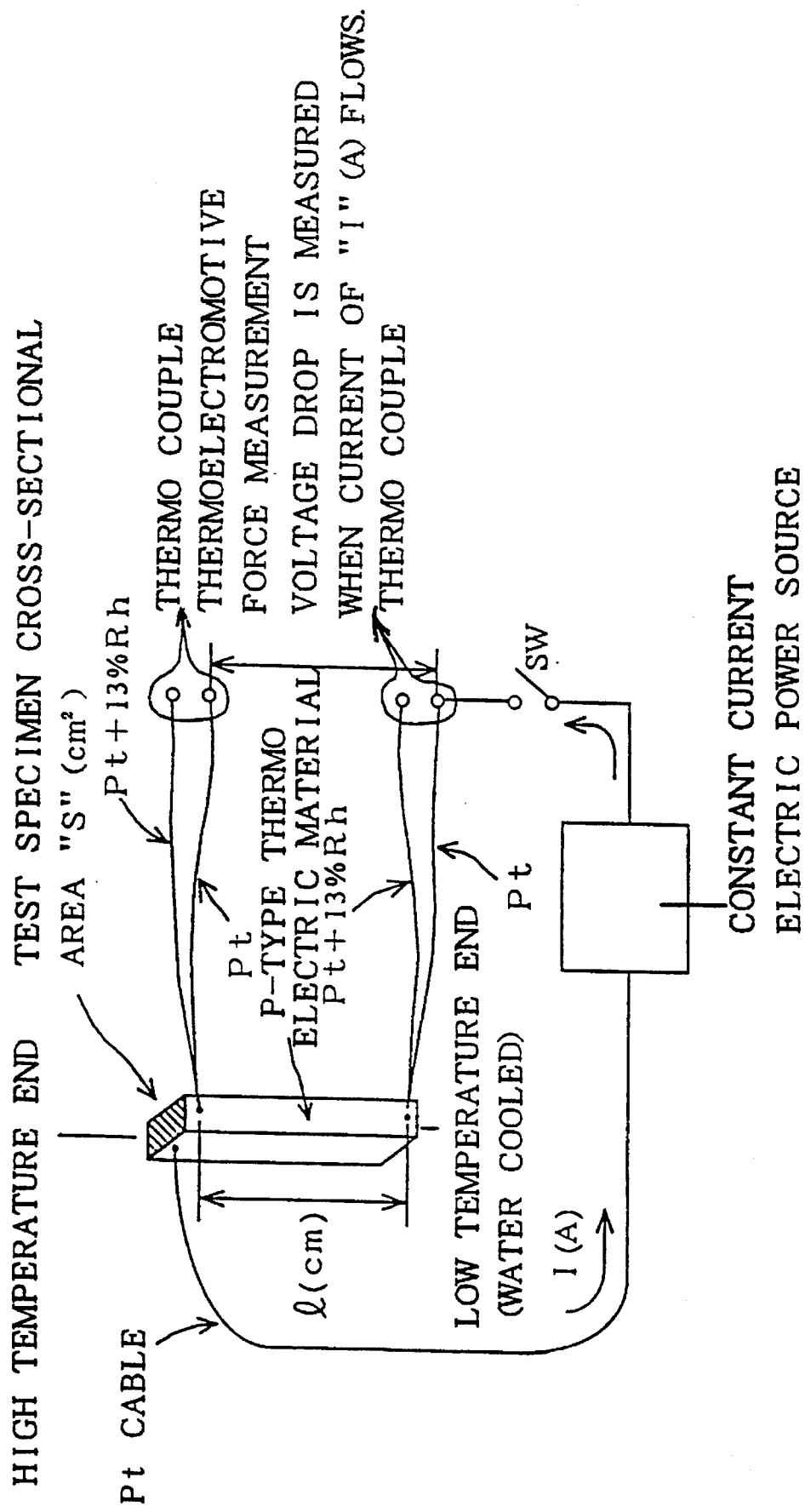
FIG. 1 is a schematic circuit diagram for explaining the principle for evaluating a thermoelectromotive force "E", a mean resistivity "ρ" and an effective maximum power "P" exhibited by P-type thermoelectric material.

The thermoelectromotive force "E", the mean resistivity "ρ", and the effective maximum power "P" were measured in accordance with the following measuring principle. As illustrated in FIG. 1, a rectangular parallelepiped-shaped P-type thermoelectric material having a cross-sectional area of "S" cm$^2$ and a length of "1" cm is provided with a thermo couple comprised of a Pt cable and a Pt-13% by weight Rh cable at the ends. Then, the P-type thermoelectric material is heated at the upper end in the drawing so as to make it into a high temperature end, and it is cooled, for instance by means of water, at the lower end in the drawing so as to make it into a low temperature end. Further, the high temperature end and the low temperature end of the P-type thermoelectric material are connected to a constant current electric power supply by way of a switch "SW". When the switch "SW" is opened, the thermoelectromotive force "E" of the P-type thermoelectric material is measured. When the switch "SW" closed to flow a constant current I (A), the mean resistivity "ρ" of the P-type thermoelectric material is measured. Then, the effective maximum power "P" is calculated with an equation, $P=E^2/4\rho$.

Second through Sixth Preferred Embodiments and Comparative Examplels Nos. 1 through 3

Except that alloy ingots were prepared which contained Mn and Al as set forth in Table 1 below, P-type thermoelectric materials according to the Second through Sixth Preferred Embodiments and Comparative Example Nos. 1 through 3 were produced which were sintered by hot pressing.

The resulting hot-pressing-sintered P-type thermoelectric materials according to the Second through Sixth Preferred Embodiments and Comparative Example Nos. 1 through 3 thus produced were measured for the thermoelectromotive force "E" and the mean resistivity "ρ" in the same manner as set forth in the "First Preferred Embodiment" section, and the effective maximum power "P" was calculated with the equation, $P=E^2/4\rho$. The results of the measurements are set forth respectively in lines designated with "Ex. 2 through 6" and Comp. Ex. 1 through 3" of Table 2 below together with the compositions of the P-type thermoelectric materials according to the Second through Sixth Preferred Embodiments and Comparative Example Nos. 1 through 3.

TABLE 1

Compositions of Alloy Ingots for Producing P-type Thermoelectric Materials according to the First through Sixth Preferred Embodiments and Comparative Example Nos. 1 through 3

| Identi-fication | Mn and Al Contents | | | Composition Formula of Alloy Ingot: $Fe_{1-x}Mn_xSi_{2-y}Al_y$ (Quantity of Component Elements: Number of Moles) |
|---|---|---|---|---|
| | Mn Content (%) | Al Content (%) | Sum of Mn & Al Contents (%) | |
| Ex. 1 | 4.0 | 1.33 | 5.33 | $Fe_{0.88}Mn_{0.12}Si_{1.96}Al_{0.04}$ |
| Ex. 2 | 2.67 | 1.67 | 4.34 | $Fe_{0.92}Mn_{0.08}Si_{1.95}Al_{0.05}$ |
| Ex. 3 | 2.67 | 2.0 | 4.67 | $Fe_{0.92}Mn_{0.08}Si_{1.94}Al_{0.06}$ |
| Ex. 4 | 2.67 | 2.33 | 5.00 | $Fe_{0.92}Mn_{0.08}Si_{1.93}Al_{0.07}$ |
| Ex. 5 | 2.167 | 2.0 | 4.167 | $Fe_{0.93}Mn_{0.07}Si_{1.94}Al_{0.06}$ |
| Ex. 6 | 1.67 | 2.67 | 4.34 | $Fe_{0.95}Mn_{0.05}Si_{1.92}Al_{0.08}$ |
| Comp. Ex. 1 | 1.67 | 2.0 | 3.67 | $Fe_{0.95}Mn_{0.05}Si_{1.94}Al_{0.06}$ |
| Comp. Ex. 2 | 0.67 | 2.0 | 2.67 | $Fe_{0.98}Mn_{0.02}Si_{1.94}Al_{0.06}$ |
| Comp. Ex. 3 | 0.67 | 2.67 | 3.34 | $Fe_{0.98}Mn_{0.02}Si_{1.92}Al_{0.08}$ |

TABLE 2

Thermoelectric Properties of the Hot-Pressing-Sintered P-type Thermoelectric Materials according to the First through Sixth Preferred Embodiments and Comparative Example Nos. 1 through 3

| Identi-fication | Mn and Al Contents | | | Thermoelectric Properties | | |
|---|---|---|---|---|---|---|
| | Mn Content (%) | Al Content (%) | Sum of Mn & Al Contents (%) | "E" (mV) | "ρ" (ohm-cm) | "P" (Wcm/cm²) |
| Ex. 1 | 4.0 | 1.33 | 5.33 | 193.87 | 0.00816 | 1.152 |
| Ex. 2 | 2.67 | 1.67 | 4.34 | 180.36 | 0.00566 | 1.437 |
| Ex. 3 | 2.67 | 2.0 | 4.67 | 172.04 | 0.00576 | 1.285 |
| Ex. 4 | 2.67 | 2.33 | 5.00 | 143.24 | 0.00458 | 1.12 |
| Ex. 5 | 2.167 | 2.0 | 4.167 | 189.24 | 0.00631 | 1.419 |
| Ex. 6 | 1.67 | 2.67 | 4.34 | 162.0 | 0.00602 | 1.090 |
| Comp. Ex. 1 | 1.67 | 2.0 | 3.67 | 180.26 | 0.00683 | 1.188 |
| Comp. Ex. 2 | 0.67 | 2.0 | 2.67 | 178.41 | 0.00727 | 1.094 |
| Comp. Ex. 3 | 0.67 | 2.67 | 3.34 | 178.96 | 0.00704 | 1.137 |

"E": Thermoelectromotive Force, "ρ": Mean Resistivity, "P": Effective Maximum Power

First Evaluation

The following were appreciated from Table 2 summarizing the results from examining for the thermoelectric properties exhibited by the hot-pressing-sintered P-type thermoelectric materials according to the First through Sixth Preferred Embodiments and Comparative Example Nos. 1 through 3. Firstly, with some exceptions, the thermoelectromotive force "E" tended to increase as the Mn content increased; namely: in the order of from the Sixth Preferred Embodiment to the First Preferred Embodiment.

Secondly, the mean resistivity "ρ" tended to decrease as the sum of the Mn and Al contents decrease, namely, excepting the First and Second Preferred Embodiments, in the order of the Fifth, Six, Third and Fourth Preferred Embodiments. In addition, the Second Preferred Embodiment and the Third through Sixth Preferred Embodiments exhibited the mean resistivity "ρ" which was equal to or less than 0.0053 ohm-cm, e.g., the mean resistivity "ρ" of the aforementioned iron disilicide N-type thermoelectric material.

For instance, the average value of the mean resistivities "ρ" of the hot-pressing-sintered P-type thermoelectric materials according to the First through Sixth Preferred Embodiments which was 0.00608 ohm-cm. The average value was smaller by 13.6% than the mean resistivity "ρ" of 0.00704 ohm-cm exhibited by Comparative Example No. 3 which had the composition set forth in Japanese Examined Patent Publication (KOKOKU) No. 60-43,881.

Thirdly, when the effective maximum powers "P" of the hot-pressing-sintered P-type thermoelectric material according to the First through Sixth Preferred Embodiments were compared with those of Comparative Example Nos. 1 through 3, the average value of the effective maximum powers "P" of the P-type thermoelectric material according to the First through Sixth Preferred Embodiments was 1.2505 Wcm/cm² and this average value was larger by about 10% than the effective maximum power "P" of 1.137 Wcm/cm² produced by Comparative Example No. 3 which had the composition set forth in Japanese Examined Patent Publication (KOKOKU) No. 60-43,881. For instance, the P-type thermoelectric materials, according the Third, Fourth and Sixth Preferred Embodiments, produced thermoelectromotive forces "E" which were inferior to that of Comparative Example No. 3. However, the P-type thermoelectric materials according to these preferred embodiments exhibited mean resistivities "ρ" which were smaller than that of Comparative Example No. 3, and consequently they produced effective maximum power "P" substantially equal to that of Comparative Example No. 3. In other words, when the mean resistivity "ρ" is decreased, even if the thermoelectromotive force "E" is poor, the effective maximum power "P" is increased, because the effective maximum power "P" is calculated from the equation, $P=E^2/4\rho$.

As a result, when a thermoelectric unit is constituted with the hot-pressing-sintered P-type thermoelectric materials according to the First through Sixth Preferred Embodiments, and the N-type thermoelectric material, for instance, the iron disilicide N-type thermoelectric material, the inherent high capacities of the P-type thermoelectric materials according to the First through Sixth Preferred Embodiments and the iron disilicide N-type thermoelectric material can be fully utilized, and thereby the thermoelectric unit can be remarkably enhanced in the performance as a whole.

Second Evaluation

In order to verify the advantageous effects produced by the present P-type thermoelectric material, a plurality of alloy ingots were prepared whose Al content was fixed and whose Mn content was varied from 0 to 4.0%. The resulting alloy ingots were processed by the production process of to the First Preferred Embodiment, thereby producing 7 P-type thermoelectric materials, i.e. test specimen groups A through G, whose Al content was fixed and which were sintered by hot pressing.

Figure 2:
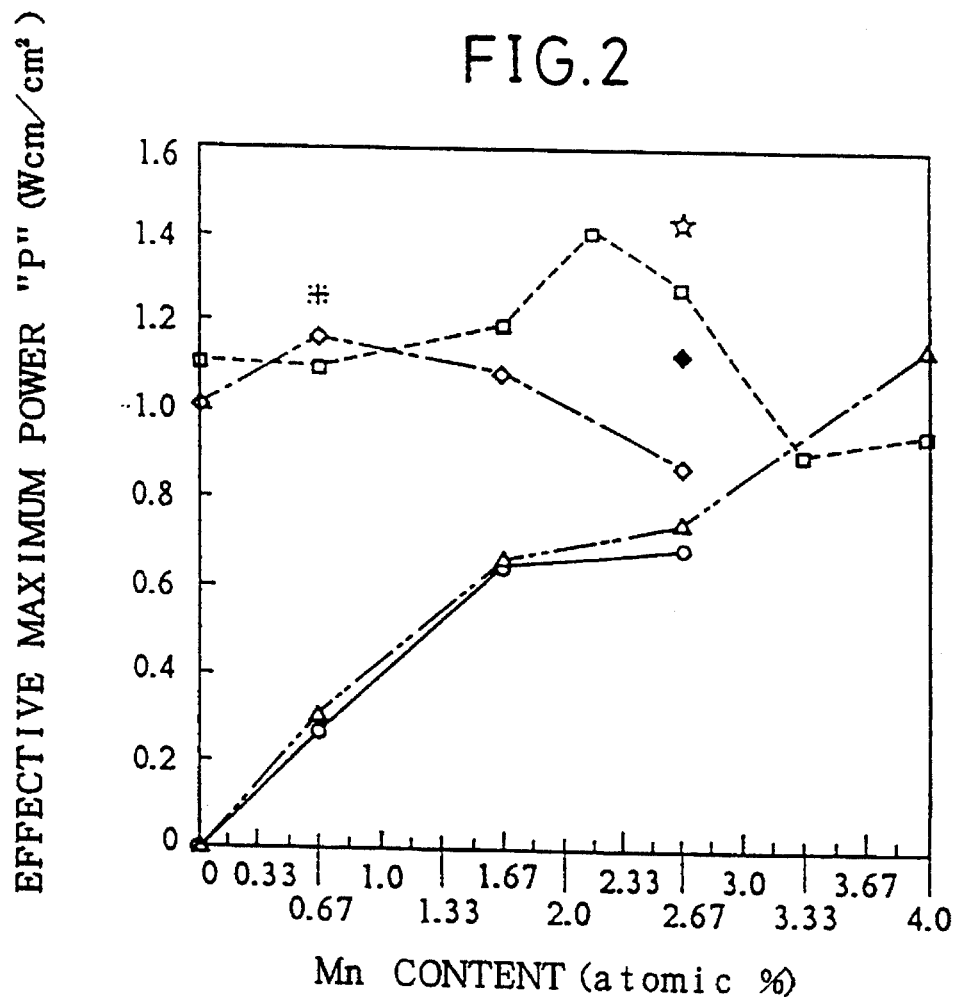
FIG. 2 is a graph for illustrating variations of the effective maximum powers "P" exhibited by P-type thermoelectric materials comprised of iron disilicide which were produced by hot pressing and in which the Al content was fixed and the Mn content was varied.

These hot-pressing-sintered P-type thermoelectric materials of the test specimen groups A through G were examined for the effective maximum power "P" under a temperature difference of 800° C. by the same method as set forth in the "First Preferred Embodiment" section. FIG. 2 illustrates the results of the measurements, for instance, the variations of the effective maximum power "P" with respect to the variations of the Mn content under the fixed Al contents.

It is apparent from FIG. 2 that the test specimen groups B through G containing Al in the claimed range of the present invention (e.g., 1.33%≦Al≦3.33%), ass whole, produced the effective maximum powers "P" which were larger than those of the test specimen group A containing Al in the amount outside the claimed range of the present invention.

In particular, among the test specimen groups B through G, the test specimen group B produced the effective maximum powers "P" which could approximate to those of the test specimen group A in the Mn content of from 0 to 1.67%. However, when the test specimen group B contained Mn in the claimed range of the present invention (e.g., 1.67%≦Mn≦4.1%), they tended to produce the effective maximum powers "P" which deviated from those of the test specimen group A.

Except the test specimen group B, the other test specimen groups did not seem to produce the effective maximum power "P" which increased in proportion to the increment of the Mn content. However, when Mn was contained in the claimed range of the present invention (e.g., 1.67%≦Mn≦4.1%), all of the test specimen groups C through G produced the fairly large effective maximum powers "P".

In view of the behavior of the effective maximum powers "P" produced by the test specimen groups C and D, it is believed that the effective maximum power "P" decreases when the sum of the Mn content and the Al content exceeds the claimed sum of the present invention (e.g., 4.0%≦Mn+Al≦5.34%).

Third Evaluation

In order to furthermore verify the advantageous effects produced by the present P-type thermoelectric material, a plurality of alloy ingots were prepared whose Mn content was fixed and whose Al content was varied from 0.67 to 3.33%. The resulting alloy ingots were processed by the identical production process with that for the P-type thermoelectric material according to the First Preferred Embodiment, thereby producing 4 P-type thermoelectric materials, classified into test specimen groups H through K, whose Mn content was fixed and which were sintered by hot pressing.

Figure 3:
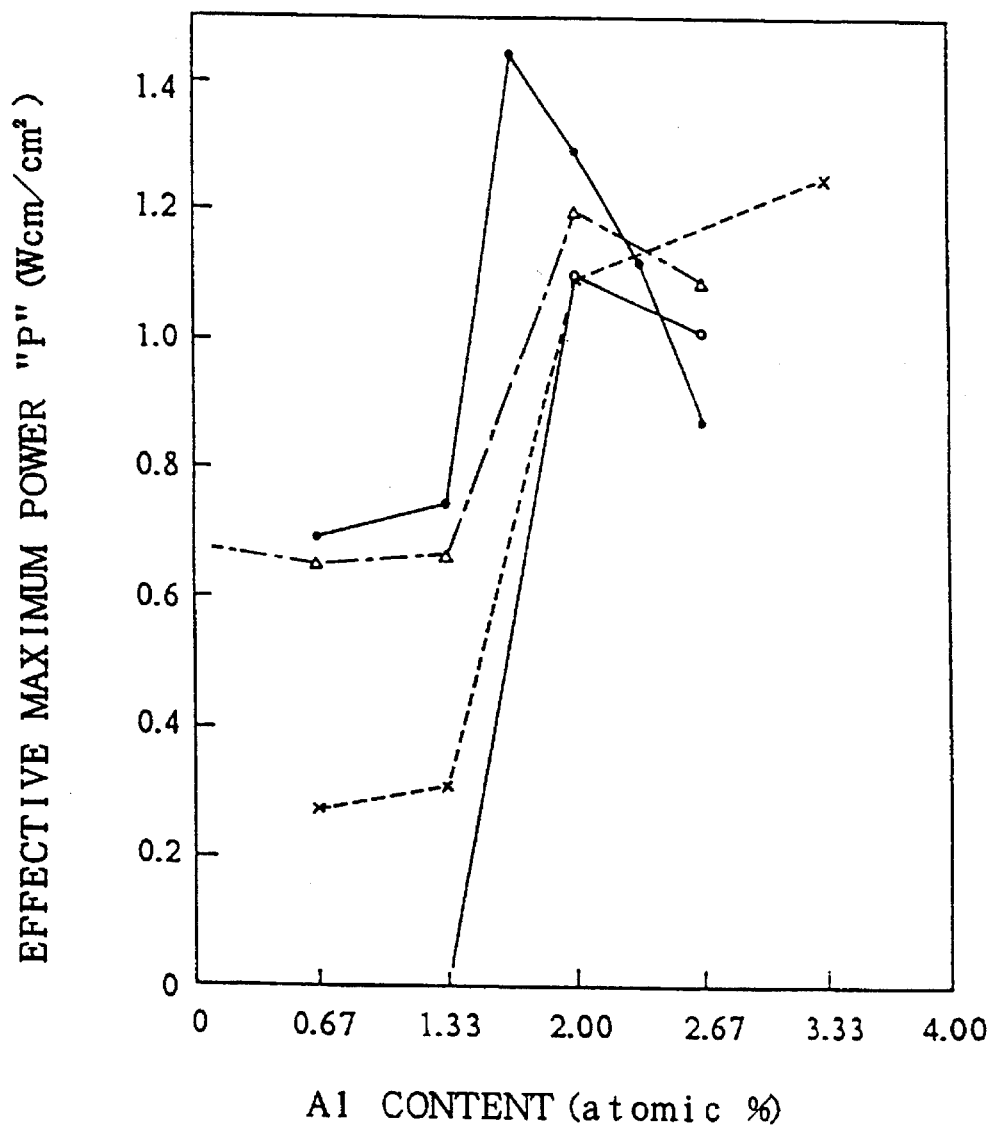
FIG. 3 is a graph for illustrating variations of the effective maximum powers "P" exhibited by P-type thermoelectric materials comprised of iron disilicide which were produced by hot pressing and in which the Mn content was fixed and the Al content was varied.

These hot-pressing-sintered P-type thermoelectric materials of the test specimen groups H through K were examined for the effective maximum power "P" under the temperature difference of 800° C. by the same method as set forth in the "First Preferred Embodiment" section. FIG. 3 illustrates the results of the measurements, for instance, the variations of the effective maximum power "P" with respect to the variations of the Al content under the fixed Mn contents.

It is apparent from FIG. 3 that the test specimen groups J and K containing Al in a range of from 1.33 to 2.0% and Mn in the claimed range of the present invention (e.g., 1.67%≦Mn≦4.1%) produced the effective maximum powers "P" which were larger than those of the test specimen group H and I containing Mn in the amount outside the claimed range of the present invention.

When Al was contained in an amount of from 2.0 to 2.67%, the test specimen groups J and K produced the effective maximum powers "P" which were substantially equal to those of the test specimen groups H and I. However, when Al was contained in the amount of 2.0 to 2.67%, the test specimen groups H, J and K, other than the test specimen group I, tended to produce the decreasing effective maximum powers "P". For instance, in the test specimen groups J and K containing Mn in the fixed contents, 1.67% and 2.67%, respectively, the Al contents were too excessive. Therefore, it was found unpreferable that the sum of the Mn content and the Al content exceeds the claimed sum of the present invention (e.g., 4.0%≦Mn+Al≦5.34%).

In particular, the test specimen group I whose Mn content was fixed at 0.67% tended to produce the increasing effective maximum powers "P" in proportion to the increment of the Al content. However, it exhibited the considerably smaller value than those of the test specimen groups J and K around the Al content of 1.33%. Hence, it was not a preferable thermoelectric material in view of practical applications.

Seventh Preferred Embodiment

First of all, an alloy ingot was prepared, and it was comprised of iron disilicide containing Mn and Al in an amount of 3.33% and 2.0% respectively. Namely, in the alloy ingot comprised of the iron disilicide, a sum of the Mn content and the Al content was 5.33%. When the iron disilicide is expressed with the composition formula, $Fe_{1-x}Mn_xSi_{2-y}Al_y$, in which the quantities of the constituent elements are expressed in number of moles, it can be expressed with $Fe_{0.9}Mn_{0.1}Si_{1.94}Al_{0.06}$. The composition of the alloy ingot and the composition formula is set forth in a line designated with "Ex. 7" of Table 3 below.

The alloy ingot comprised of the iron disilicide having the aforementioned composition was pulverized with a mortar made of iron to a powder having an average particle diameter of 0.5 mm. The resulting powder was further pulverized with a centrifugal mill to a fine powder having an average particle diameter of from 2 to 3 micrometers.

Then, an aqueous solution was added to the resulting fine powder, and it contained polyvinyl alcohol in an amount of 0.5% by weight with respect to the total weight of the fine powder. The resulting mixture was heated while stirring, thereby evaporating the water content. Thus, nodular particles were prepared which contained water in an amount of 8% by weight and had an average particle diameter of from 1 to 2 mm. The resulting nodular particles were pulverized with a mortar, and they were classified with a sieve, thereby granulating them to a granular powder having an average particle diameter of from 0.2 to 0.5 mm.

Then, the resulting granular powder was subjected to press-forming while applying a pressure of 163.8 MPa, thereby preparing a green compact in a form of a rectangular parallelepiped having a length of 6 mm, a width of 6 mm and a height of 40 mm. The resulting green compact was roasted from room temperature to 310° C. in air. Thereafter, the roasted green compact was heated at a temperature of 1,185° C. for 3.5 hours in a vacuum of 1.33 Pa to carry out sintering, thereby preparing a sintered body having a relative density of 92% or more. Finally, the resulting sintered body was further heated at a temperature of 760° C. for 100 hours in air, and it was cooled in furnace. Through this process, it was subjected to the beta-heat treatment. By thus carrying out a series of processes, a P-type thermoelectric material according to the Seventh Preferred Embodiment was produced which was sintered by atmospheric sintering.

The atmospherically-sintered P-type thermoelectric material according to the Seventh Preferred Embodiment thus produced was examined for the thermoelectric properties. For instance, it was measured, under a temperature difference of 800° C., for the thermoelectromotive force "E" and the means resistivity "ρ" and the effective maximum power "P" in the same manner as set forth in the "First Preferred Embodiment" section. The results of the measurements are set forth in a line designated with "Ex. 7" of Table 4 below together with the composition of the P-type thermoelectric material according to the Seventh Preferred Embodiment.

Eighth through Eleventh Preferred Embodiments and Comparative Examples Nos. 4 through 9

Except that alloy ingots were prepared which contained Mn and Al as set forth in Table 3 below, P-type thermoelectric materials according to the Eighth through Eleventh Preferred Embodiments and Comparative Example No. 4 through 9 were produced which were sintered by atmospheric sintering.

The resulting atmospherically-sintered P-type thermoelectric materials according to the Eighth through Eleventh Preferred Embodiments and Comparative Example Nos. 4 through 9 thus produced were measured for the thermoelectromotive force "E" and the means resistivity "ρ" and the effective maximum power "P" in the same manner as set forth in the "First Preferred Embodiment" section. The results of the measurements are set forth respectively in lines designated with "Ex. 8 through 11 and Comp. Ex. 4 through 9" of Table 4 below together with the compositions of the P-type thermoelectric materials according to the Eighth through Eleventh Preferred Embodiments and Comparative Example Nos. 4 through 9.

TABLE 3

Compositions of Alloy Ingots for Producing P-type Thermoelectric Materials according to the Seventh through Eleventh Preferred Embodiments and Comparative Example Nos. 4 through 9

| Identification | Mn and Al Contents | | | Composition Formula of Alloy Ingot: $Fe_{1-x}Mn_xSi_{2-y}Al_y$ |
|---|---|---|---|---|
| | Mn Content (%) | Al Content (%) | Sum of Mn & Al Contents (%) | (Quantity of Component Elements: Number of Moles) |
| Ex. 7 | 3.33 | 2.0 | 5.33 | $Fe_{0.9}Mn_{0.1}Si_{1.94}Al_{0.06}$ |
| Ex. 8 | 2.67 | 2.67 | 5.34 | $Fe_{0.92}Mn_{0.08}Si_{1.92}Al_{0.08}$ |
| Ex. 9 | 2.67 | 1.33 | 4.0 | $Fe_{0.92}Mn_{0.08}Si_{1.96}Al_{0.04}$ |
| Ex. 10 | 2.67 | 2.0 | 4.67 | $Fe_{0.92}Mn_{0.08}Si_{1.94}Al_{0.06}$ |
| Ex. 11 | 1.67 | 2.67 | 4.34 | $Fe_{0.95}Mn_{0.05}Si_{1.92}Al_{0.08}$ |
| Comp. Ex. 4 | 3.33 | 2.67 | 6.00 | $Fe_{0.09}Mn_{0.1}Si_{1.92}Al_{0.08}$ |
| Comp. Ex. 5 | 1.67 | 2.0 | 3.67 | $Fe_{0.95}Mn_{0.05}Si_{1.94}Al_{0.06}$ |
| Comp. Ex. 6 | 1.67 | 1.33 | 3.0 | $Fe_{0.95}Mn_{0.05}Si_{1.96}Al_{0.04}$ |
| Comp. Ex. 7 | 0.67 | 2.67 | 3.34 | $Fe_{0.98}Mn_{0.02}Si_{1.92}Al_{0.08}$ |
| Comp. Ex. 8 | 0.67 | 2.0 | 2.67 | $Fe_{0.98}Mn_{0.02}Si_{1.94}Al_{0.06}$ |
| Comp. Ex. 9 | 0.67 | 1.33 | 2.0 | $Fe_{0.98}Mn_{0.02}Si_{1.96}Al_{0.04}$ |

TABLE 4

Thermoelectric Properties of the Atmospherically-Sintered P-type Thermoelectric Materials according to the Seventh through Eleventh Preferred Embodiments and Comparative Example Nos. 4 through 9

| Identification | Mn and Al Contents | | | Thermoelectric Properties | | |
|---|---|---|---|---|---|---|
| | Mn Content (%) | Al Content (%) | Sum of Mn & Al Contents (%) | "E" (mV) | "ρ" (ohm-cm) | "P" (Wcm/cm²) |
| Ex. 7 | 3.33 | 2.0 | 5.33 | 195.19 | 0.00724 | 1.315 |
| Ex. 8 | 2.67 | 2.67 | 5.34 | 184.78 | 0.00654 | 1.304 |
| Ex. 9 | 2.67 | 1.33 | 4.0 | 128.92 | 0.1383 | 0.30 |

TABLE 4-continued

Thermoelectric Properties of the Atmospherically-Sintered P-type Thermoelectric Materials according to the Seventh through Eleventh Preferred Embodiments and Comparative Example Nos. 4 through 9

| Identi-fication | Mn and Al Contents | | | Thermoelectric Properties | | |
|---|---|---|---|---|---|---|
| | Mn Content (%) | Al Content (%) | Sum of Mn & Al Contents (%) | "E" (mV) | "ρ" (ohm-cm) | "P" (Wcm/cm$^2$) |
| Ex. 10 | 2.67 | 2.0 | 4.67 | 167.82 | 0.00531 | 1.327 |
| Ex. 11 | 1.67 | 2.67 | 4.34 | 171.73 | 0.00605 | 1.219 |
| Comp. Ex. 4 | 3.33 | 2.67 | 6.00 | 45.57 | 0.00127 | 0.408 |
| Comp. Ex. 5 | 1.67 | 2.0 | 3.67 | 193.49 | 0.01219 | 0.768 |
| Comp. Ex. 6 | 1.67 | 1.33 | 3.0 | 123.99 | 0.01527 | 0.252 |
| Comp. Ex. 7 | 0.67 | 2.67 | 3.34 | 199.33 | 0.00943 | 1.053 |
| Comp. Ex. 8 | 0.67 | 2.0 | 2.67 | 187.79 | 0.03318 | 0.266 |
| Comp. Ex. 9 | 0.67 | 1.33 | 2.0 | 152.36 | 0.03729 | 0.156 |

"E": Thermoelectromotive Force, "ρ": Mean Resistivity, "P": Effective Maximum Power Fourth Evaluation The following were appreciated from Table 4, which summarized the results of the examinations for the thermoelectric properties exhibited by the atmospherically-sintered P-type thermoelectric materials according to the Seventh through Eleventh Preferred Embodiments and Comparative Example Nos. 4 through 9. Firstly, with some exceptions such, as the Ninth and Tenth Preferred Embodiments, the thermoelectromotive force "E" increased as the Mn content increased, namely: in the order of from the Eleventh, Eighth and Seventh Preferred Embodiments. Contrary to the hot-pressing-sintered P-type thermoelectric materials according to the First through Sixth Preferred Embodiments, in the atmospherically-sintered P-type thermoelectric materials according to the Seventh through Eleventh Preferred Embodiments, the mean resistivity "ρ" scarcely decreased as the sum of the Mn and Al contents increase. Except for the Ninth Preferred Embodiment, the Seventh, Eighth, Tenth and Eleventh Preferred Embodiments exhibited mean resistivity "ρ" which was slightly larger than or substantially equal to 0.0053 ohm-cm (e.g., the mean resistivity "ρ" of the aforementioned iron disilicide N-type thermoelectric material).

The average value of the mean resistivity "ρ" of the Seventh, Eighth, Tenth and Eleventh Preferred Embodiments, other than the Ninth Preferred Embodiment, was, for instance, 0.00503 ohm-cm, and it was smaller by as much as 46.7% than the mean resistivity "ρ" of 0.00945 ohm-cm exhibited by Comparative Example No. 7 which had the composition set forth in Japanese Examined Patent Publication (KOKOKU) No. 60-43,881.

When the effective maximum powers "P" of the atmospherically-sintered P-type thermoelectric material according to the Seventh, Eighth, Tenth and Eleventh Preferred Embodiments, excepting the Ninth Preferred Embodiment, were compared with those of Comparative Example Nos. 4 through 9, the effective maximum powers "P" of the P-type thermoelectric material according to the Seventh, Eighth, Tenth and Eleventh Preferred Embodiments were larger by about 26% at maximum than the effective maximum power "P" of 1.053 Wcm/cm$^2$ exhibited by Comparative Example No. 7 which had the composition set forth in Japanese Examined Patent Publication (KOKOKU) No. 60-43,881.

Further, the effective maximum powers "P" were larger by one digit than those of Comparative Example Nos. 4, 5, 6, 8 and 9.

As a result, when a thermoelectric unit is constituted with the atmospherically-sintered P-type thermoelectric materials according to the Seventh, Eighth, Tenth and Eleventh Preferred Embodiments, other than the Ninth Preferred Embodiment, and the N-type thermoelectric material, for instance, the iron disilicide N-type thermoelectric material, the inherent high capacities of the P-type thermoelectric materials according to the Seventh, Eighth, Tenth and Eleventh Preferred Embodiments and the iron disilicide N-type thermoelectric material can be fully utilized, and thereby the thermoelectric unit can be remarkably enhanced in the performance as a whole.

It is still unknown why the atmospherically-sintered P-type thermoelectric material according to the Ninth Preferred Embodiment whose Mn content, Al content and sum of the Mn and Al contents fell in the claimed ranges of the present invention exhibited remarkably poorer thermoelectric properties than the atmospherically-sintered P-type thermoelectric materials according to the Seventh, Eighth, Tenth and Eleventh Preferred Embodiments which had the similar compositions. The reasons are currently under diligent investigation.

Fifth Evaluation

In order to moreover verify the advantageous effects produced by the present P-type thermoelectric material, a plurality of alloy ingots were prepared whose Al content was fixed and whose Mn content was varied from 0.67 to 3.33%. The resulting alloy ingots were processed by the identical production process with that for the P-type thermoelectric material according to the Seventh Preferred Embodiment, thereby producing 3 P-type thermoelectric materials, classified into test specimen groups L through N, whose Al content was Fixed and which were sintered by atmospheric sintering.

Figure 4:
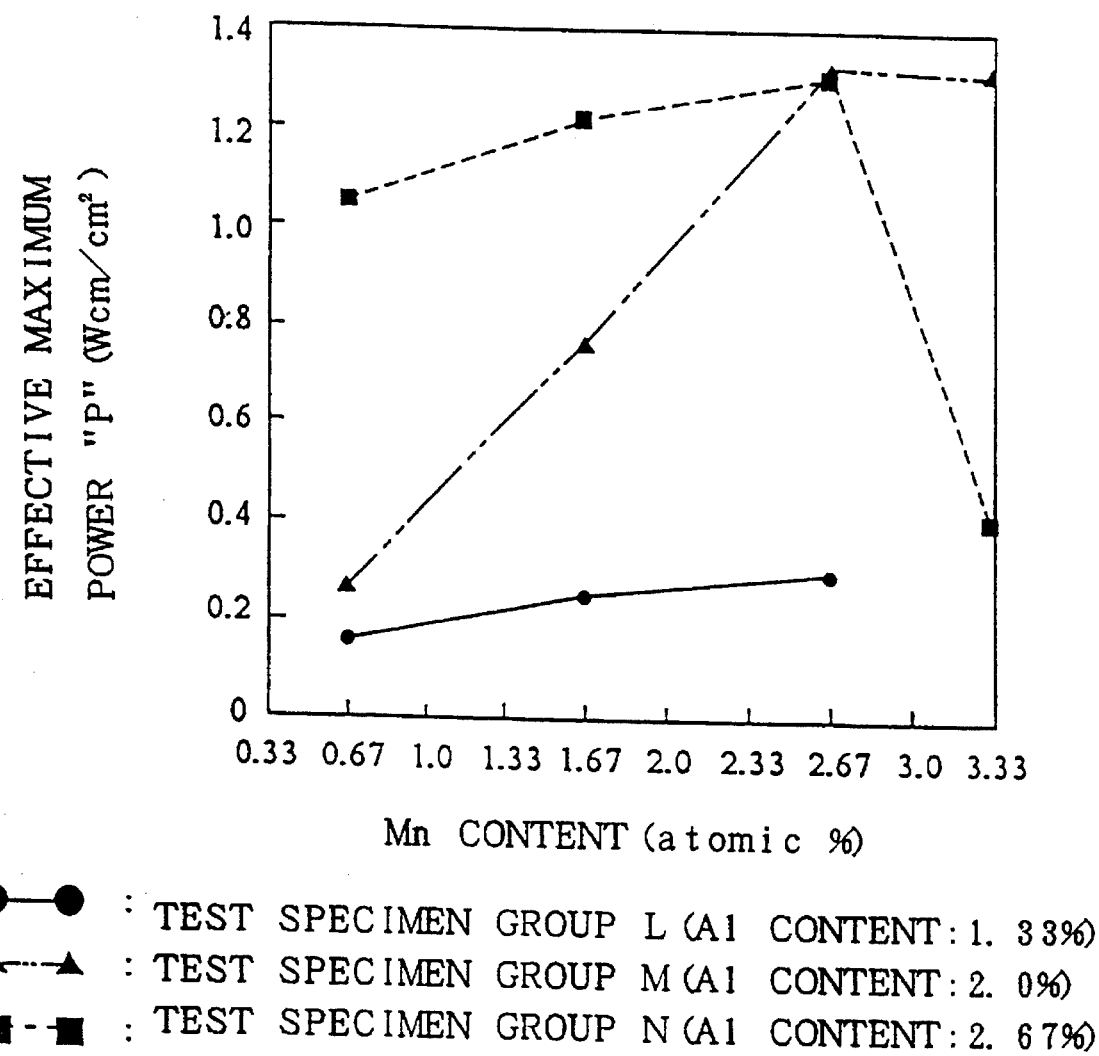
FIG. 4 is a graph for illustrating variations of the effective maximum powers "P" exhibited by P-type thermoelectric materials comprised of iron disilicide which were produced by atmospheric sintering and in which the Al content was fixed and the Mn content was varied.

These atmospherically-sintered P-type thermoelectric materials of the test specimen groups L through N were examined for the effective maximum power "P" under the temperature difference of 800° C. by the same method as set forth in the "First Preferred Embodiment" section. FIG. 4 illustrates the results of the measurements, for instance, the variations of the effective maximum power "P" with respect to the variations of the Mn content under the fixed Al contents.

It is apparent from FIG. 4 that the test specimen groups L through N, as a whole, tended to produce the increasing effective maximum powers "P" as the increment of the Mn contents. However, among the test specimen group N whose Al content was 2.67%, there was the P-type thermoelectric material containing Mn in an amount of 3.33%, and accordingly the sum of the Mn and Al contents was 6.0% which was outside the claimed range (4.0%≦Mn+Al≦5.34%) of the present invention. As a result, the P-type thermoelectric material having such a composition produced the sharply decreased effective maximum power "P".

Sixth Evaluation

Another preferred embodiment of the P-type thermoelectric material according to the present invention which was produced by mechanical alloying process will be hereinafter described.

First of all, the following metallic powders were prepared as raw materials: a metallic iron powder having an average particle diameter of 150 micrometers or less, a metallic silicon powder having an average particle diameter of 10 micrometers or less, a metallic manganese powder having an average particle diameter of 75 micrometers, and a metallic aluminum powder having an average particle diameter of 180 micrometers or less. With these 4 metallic powders, 3 mixed metallic powders were prepared which were expressed with the composition formula, $Fe_{1-x}Mn_xSi_{2-y}Al_y$, in which the quantity x was fixed (e.g., x=0.06) and the quantity y was varied to three quantities (e.g., y=0.06, 0.09, and 0.12).

The mechanical alloying process was carried out as follows. With a pot and a bowl made from a stainless steel, 36 grams of each of the aforementioned metallic powders was weighed in a glove box whose oxygen concentration and water vapor concentration were at set 1 ppm or less and at 10 ppm or less respectively, and it was charged and sealed in the pot. Then, the pot was subjected to milling at room temperature 200 hours, thereby preparing a mechanically alloyed powder having an average particle diameter of about 1 micrometer or less. In addition, after charging each of the weighed metallic powders in the pot, methyl alcohol as a co-milling agent was added to the pot in an amount of 2% by weight (e.g., 0.72 grams). Then, the pot was subjected to milling, thereby similarly preparing another mechanically alloyed powder having an average particle diameter of about 1 micrometer or less. Thus, 6 mechanically alloyed powders were prepared.

Figure 5:
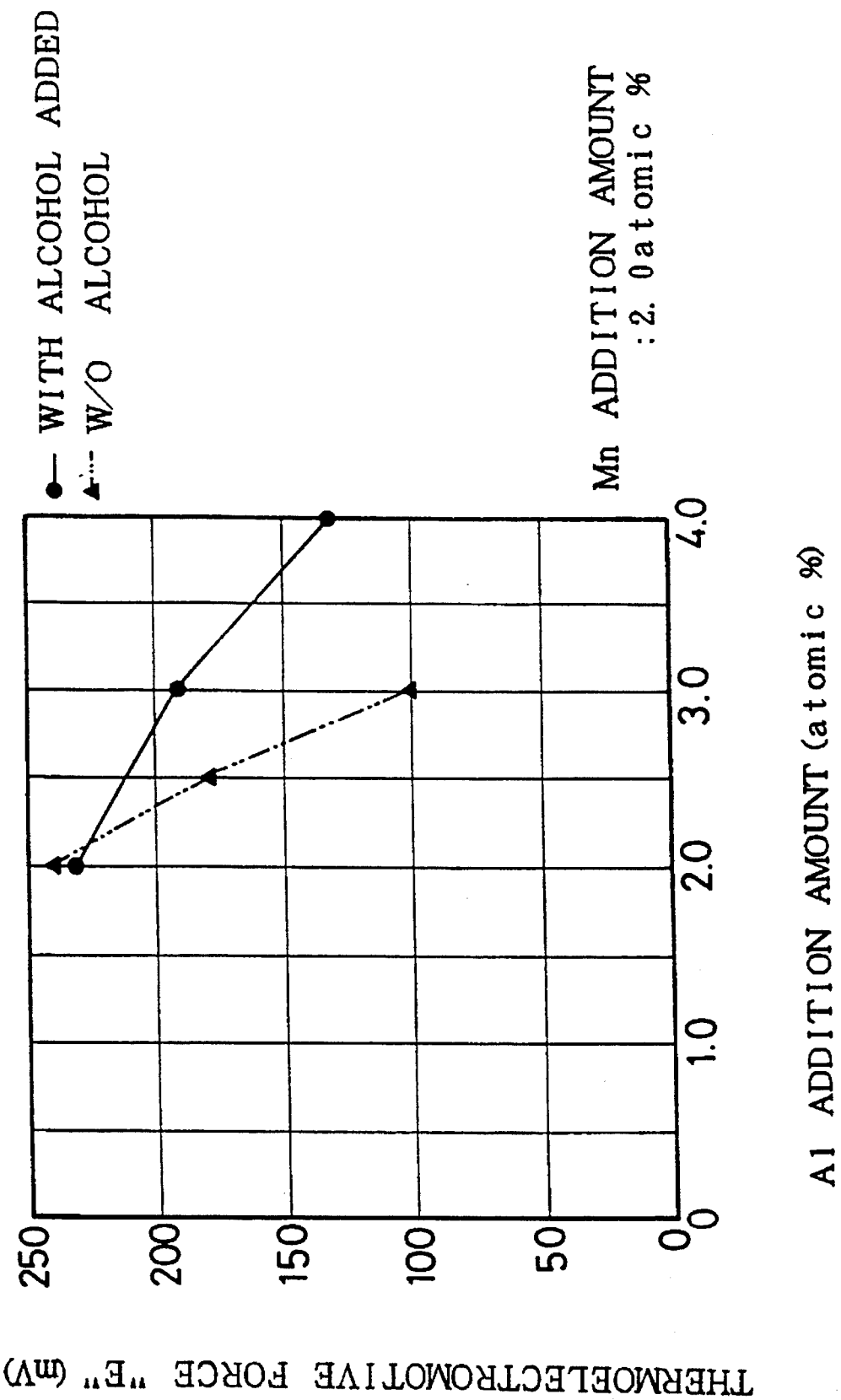
FIG. 5 is a graph for illustrating variations of the thermoelectromotive forces "E" exhibited by P-type thermoelectric materials which were produced by mechanical alloying with or without alcohol addition and in which the Mn content was fixed and the Al content was varied.
Figure 6:
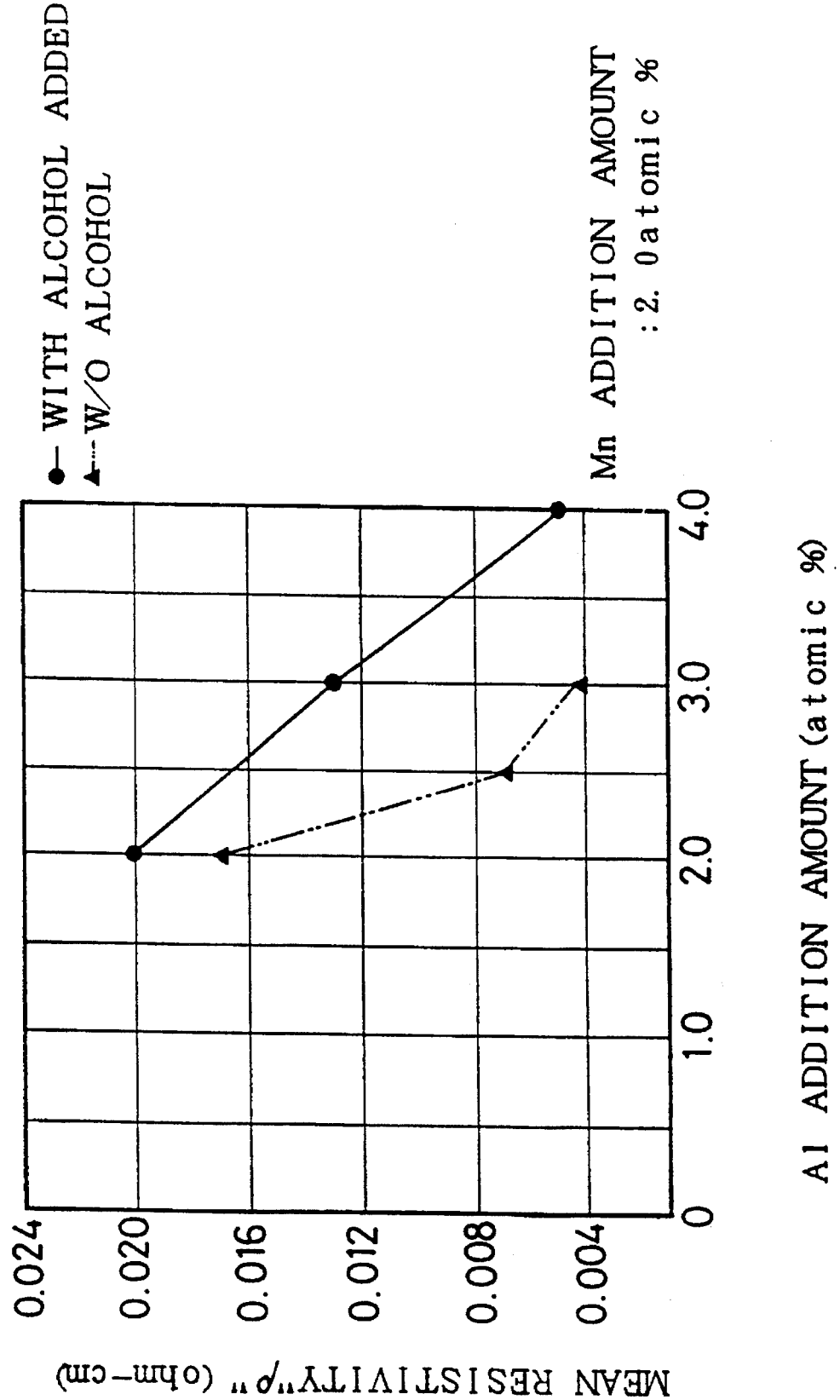
FIG. 6 is a graph for illustrating variations of the mean resistivities "ρ" exhibited by P-type thermoelectric materials which were produced by mechanical alloying with or without alcohol addition and in which the Mn content was fixed and the Al content was varied.
Figure 7:
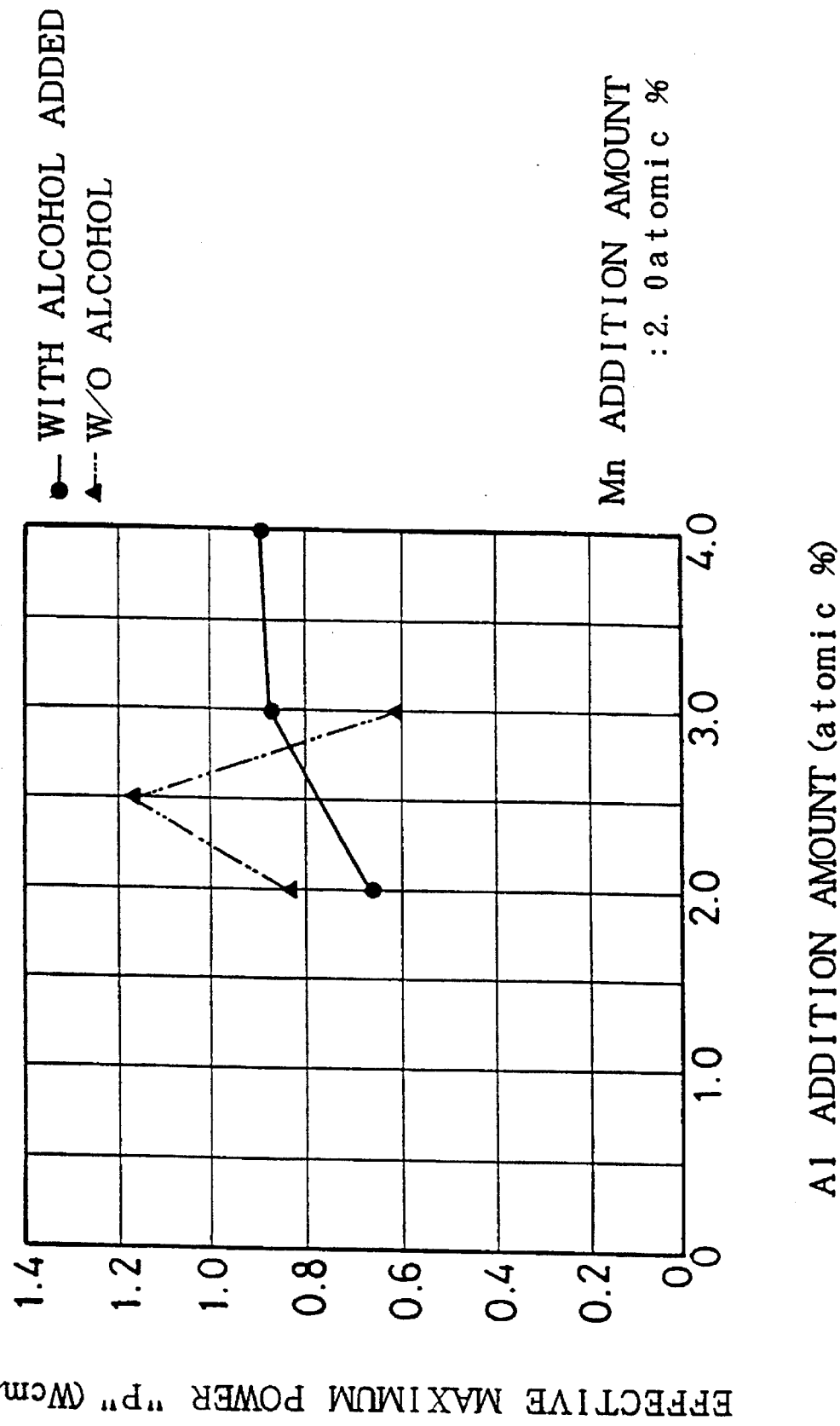
FIG. 7 is a graph for illustrating variations of the effective maximum powers "P" exhibited by P-type thermoelectric materials which were produced by mechanical alloying with or without alcohol addition and in which the Mn content was fixed and the Al content was varied.

Thereafter, with the 6 mechanically alloyed powders, 6 P-type thermoelectric materials were produced by the exactly identical process with that for the P-type thermoelectric material according to the First Preferred Embodiment. These 6 P-type thermoelectric materials were examined, under the temperature difference of 800° C., for the thermoelectromotive force "E", the resistivity "ρ" and the effective maximum power "P" by the same method as set forth in the "First Preferred Embodiment" section. FIGS. 5, 6 and 7 illustrate the results of the measurements.

FIG. 5, illustrates the relationship between the thermoelectromotive forces "E" and the Al content. FIG. 6 illustrates the relationship between the mean resistivities "ρ" and the Al content. As can be appreciated from FIGS. 5 and 6, the P-type thermoelectric materials (made from the mechanically alloyed powders free from the alcohol addition, and those made from the mechanically alloyed powders with the alcohol addition) exhibited thermoelectric properties which differed from each other. When alcohol was added during the mechanical alloying process, the resulting P-type thermoelectric materials produced the advantageous effect (resulting from the Al addition) to a slightly lesser extent.

It is still unclear why the alcohol addition affected adversely. However, it is believed as follows. The oxygen atoms of the hydroxyl groups contained in the alcohol oxidized the metallic powders, especially the metallic aluminum powder, thereby substantially reducing the content of the metallic aluminum powder in the mixed metallic powder.

Seventh Evaluation

The P-type thermoelectric material according to the present invention was examined to determine how the density of the sintered body affected the thermoelectric properties.

Without adding the alcohol, the following 2 fine powders were prepared via the process of pulverizing the raw material alloys as set forth in the "Sixth Evaluation" section, and they were expressed with the composition formula, $Fe_{1-x}Mn_xSi_{2-y}Al_y$, in which the quantities x and y were fixed at 0.08 and 0.06 (e.g., x=0.08 and y=0.06), and at 0.08 and 0.04 (e.g., x=0.08 and y=0.04) respectively.

The 2 fine powders were processed into 4 P-type thermoelectric materials in the same manner as set forth in the "First Preferred Embodiment" section except that the fine powder expressed with $Fe_{1-x}Mn_xSi_{2-y}Al_y$ whose x=0.08 and y=0.06 was sintered by hot pressing at 3 different temperatures, e.g., at 1,100° C., 1,085° C. and 1,070° C., and that the fine powder expressed with $Fe_{1-x}Mn_xSi_{2-y}Al_y$ whose x=0.08 and y=0.04 was sintered by hot pressing at a sole temperature of 1,100° C.

Figure 8:
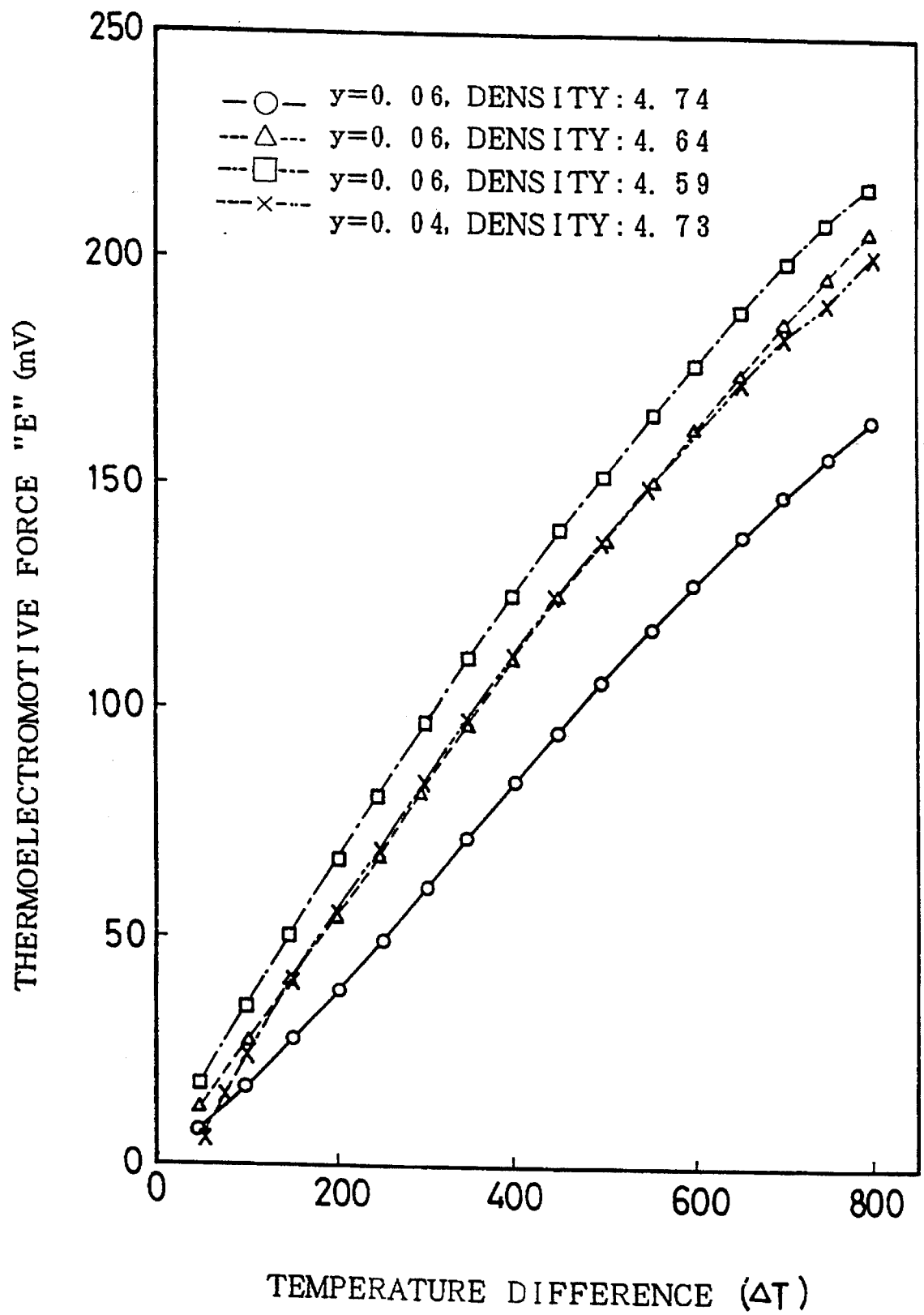
FIG. 8 is a graph for illustrating relationships between the densities of P-type thermoelectric materials and the thermoelectromotive forces "E" exhibited thereby.
Figure 9:
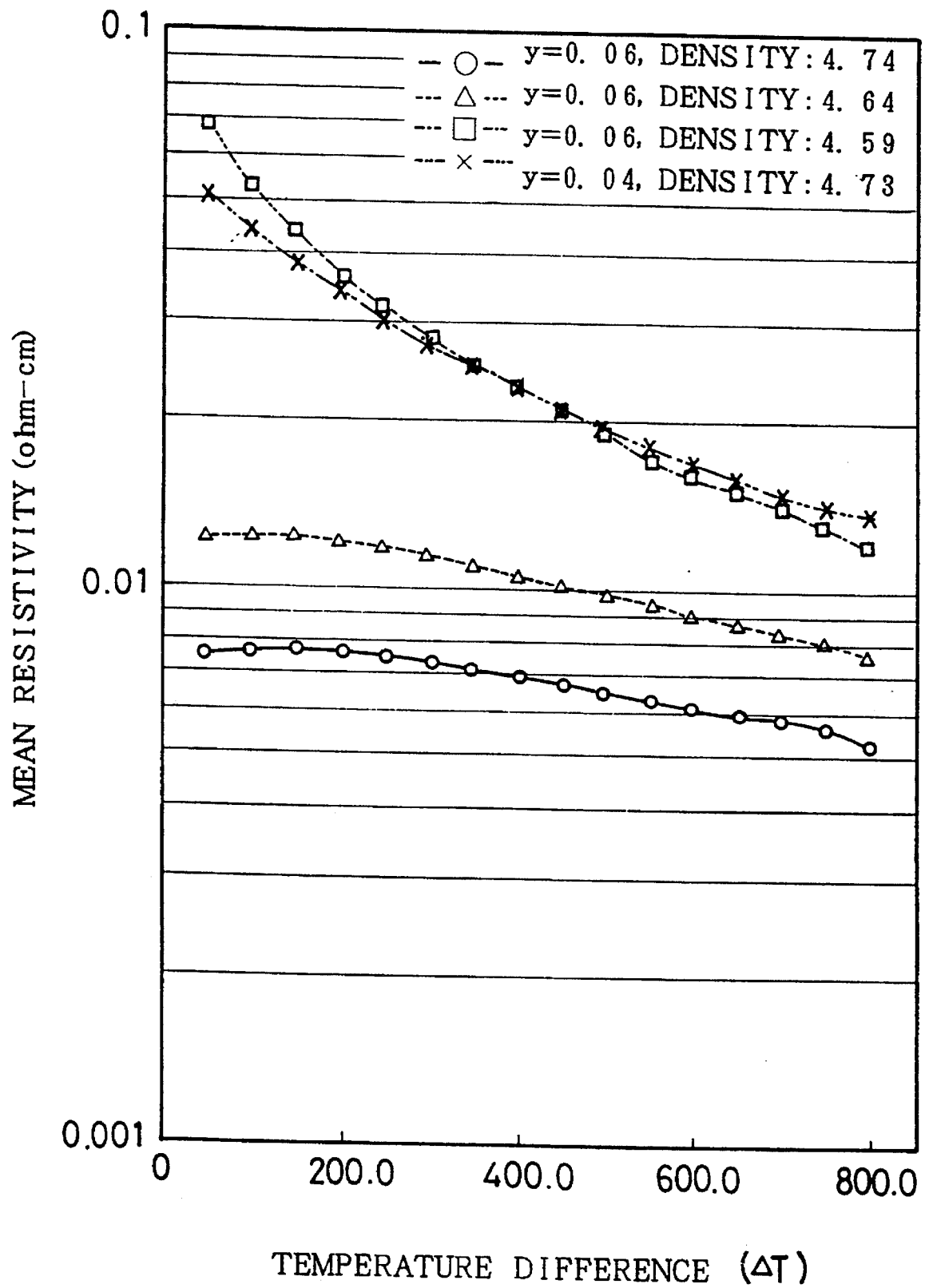
FIG. 9 is a graph for illustrating relationships between the densities of P-type thermoelectric materials and the mean resistivities "ρ" exhibited thereby.

The resulting 4 P-type thermoelectric materials were first examined for the density. Thereafter, they were examined, under the temperature difference of from 50° C. to 800° C., for the thermoelectromotive force "E", the resistivity "ρ" and the effective maximum power "P" by the same method as set forth in the "First Preferred Embodiment" section. FIGS. 8 and 9 illustrate the results of the measurements.

As shown in FIGS. 8 and 9, the P-type thermoelectric materials sintered at 1,100° C., 1,085° C. and 1,070° C. had the density of 4.74, 4.64 and 4.59 respectively. Thus, they had the density which decreased as the decrement of the sintering temperature. The P-type thermoelectric materials made from the fine powder expressed with $Fe_{1-x}Mn_xSi_{2-y}Al_y$ whose x = 0.08 and y=0.04 and sintered at 1,100° C. had the density of 4.73. Thus, the difference in the quantity y did not result in a major density difference.

As can be appreciated from FIGS. 8 and 9, it was found that the thermoelectromotive force "E" and the mean resistivity "ρ" were greatly affected by the density of the P-type thermoelectric material. Namely, it was found that both of the thermoelectromotive force "E" and the mean resistivity "ρ" increase as the density decreases. Regarding the thermoelectromotive force "E", as shown in FIG. 8, the P-type thermoelectric material whose quantity y=0.06 and whose density was 4.64 produced the thermoelectromotive force "E" substantially as large as that of the P-type thermoelectric material whose quantity y=0.04 and whose density was 4.73. Regarding the mean resistivity "ρ", as shown in FIG. 9, the P-type thermoelectric material whose quantity y=0.06 and whose density was 4.74 exhibited the mean resistivity "ρ" nearly as large as that of the P-type thermoelectric material whose quantity y=0.04 and whose density was 4.73. It is, however, unclear what factors resulted in these outcomes. The present inventors believe that the density difference associates with the following Facts. The aluminum atoms constituting the P-type thermoelectric materials are oxidized selectively during the beta-heat treatment in air, and the P-type thermoelectric material having a low density was affected greatly to the extent of the oxidation.

According to the results of the Sixth and Seventh Evaluations, it is believed that the P-type thermoelectric material according to the present invention is affected greatly by the oxidation. It is assumed that the oxidation is very likely to happen to the aluminum atoms constituting the P-type thermoelectric material, thereby reducing the effective aluminum content. However, even if the results of these evaluations are taken into account, it is still unclear how the oxidation affects the effective maximum power "P" of the P-type thermoelectric material. Namely, it is possible to say that the oxidation might increase the effective maximum power "P" of the P-type thermoelectric material. On the contrary, it is also possible to say that the oxidation might decrease the effective maximum power "P". When viewing the situation from another angle, it can be one of practical countermeasures to increase the aluminum content, in expectation of the influences resulting from the oxidation, by an amount of the aluminum atoms to be oxidized.

Having now fully described the present invention, it will be apparent to one of ordinary skill in the art that many changes and modifications can be made thereto without departing from the spirit or scope of the present invention as set forth herein including the appended claims.

What is claimed is:

1. A P-type thermoelectric material, consisting essentially of:

iron disilicide;

manganese; and aluminum;

said manganese and said aluminum dissolved in or alloyed with said iron disilicide;

said manganese contained in an amount of from 1.67 to 4.1 atomic % with respect to a total sum of iron atoms, silicon atoms, manganese atoms and aluminum atoms taken as 100 atomic %;

said aluminum contained in an amount of from 1.33 to 2.67 atomic % with respect to said total sum; and a sum of said manganese and said aluminum in an amount of from 4.0 to 5.34 atomic % with respect to said total sum.

2. A P-type thermoelectric material according to claim 1, wherein said manganese is contained in an amount of from 1.67 to 3.33% with respect to said total sum of iron atoms, silicon atoms, manganese atoms and aluminum atoms taken as 100 atomic %.

3. A P-type thermoelectric material according to claim 1, wherein said aluminum is contained in an amount of from 1.67 to 2.67% with respect to said total sum of iron atoms, silicon atoms, manganese atoms and aluminum atoms taken as 100 atomic %.

4. A P-type thermoelectric material according to claim 1, wherein said iron disilicide is beta-iron disilicide.

5. A. P-type thermoelectric material according to claim wherein said beta-iron disilicide is stoichiometric $FeSi_2$.

6. A P-type thermoelectric material according to claim 1, wherein said P-type thermoelectric material produces a thermoelectromotive force of 183 mV or more under a temperature difference of 800° C.

7. A P-type thermoelectric material according to claim 1, wherein said P-type thermoelectric material exhibits a mean resistivity of 0.0053 ohm-cm or less under a temperature difference of 800° C.

8. A P-type thermoelectric material, consisting essentially of:

iron disilicide;

metallic manganese;

metallic aluminum; and at least one of silicon oxide and aluminum oxide present in said iron disilicide;

said metallic manganese and said metallic aluminum dissolved in or alloyed with said iron disilicide;

said metallic manganese contained in an amount of from 1.67 to 4.1 atomic % with respect to a total sum of iron atoms, silicon atoms, metallic manganese atoms and metallic aluminum atoms taken as 100 atomic %;

said metallic aluminum contained in an amount of from 1.33 to 3.33 atomic % with respect to said total sum; and a sum of said metallic manganese and said metallic aluminum in an amount of from 4.0 to 5.34 atomic % with respect to said total sum.

9. A P-type thermoelectric material according to claim 8, wherein said metallic manganese is contained in an amount of from 1.67 to 3.33% with respect to said total sum of iron atoms, silicon atoms, metallic manganese atoms and said metallic aluminum atoms taken as 100 atomic %.

10. A P-type thermoelectric material according to claim 8, wherein said metallic aluminum is contained in an amount of from 1.67 to 2.67% with respect to said total sum of iron atoms, silicon atoms, metallic manganese atoms and metallic aluminum atoms taken as 100 atomic %.

11. A P-type thermoelectric material according to claim 8, wherein said iron disilicide is beta-iron disilicide.

12. A P-type thermoelectric material according to claim 11, wherein said beta-iron disilicide is stoichiometric $FeSi_2$.

13. A P-type thermoelectric material according to claim 8, wherein said P-type thermoelectric material produces a thermoelectromotive force of 183 mV or more under a temperature difference of 800° C.

14. A P-type thermoelectric material according to claim 8, wherein said P-type thermoelectric material exhibits a mean resistivity of 0.0053 ohm-cm or less under a temperature difference of 800° C.

15. A process for producing a P-type thermoelectric material, comprising the steps of:

preparing a metallic powder containing iron, silicon, manganese and aluminum in a predetermined composition;

sintering the resulting metallic powder, thereby making iron disilicide from said iron and said silicon, dissolving said manganese and said aluminum in or alloying them with the iron disilicide, and producing a sintered body; and heat treating said sintered body at a temperature within a range of from 700° to around 760° C. so as to make said sintered body into beta-phase iron disilicide;

said sintered body containing;

said manganese in an amount of from 1.67 to 4.1 atomic % with respect to total sum of iron atoms, silicon atoms, manganese atoms and aluminum atoms taken as 100 atomic %;

said aluminum being in an amount of from 1.33 to 3.33 atomic % with respect to said total sum; and a sum of said manganese and said aluminum being in an amount of from 4.0 to 5.34 atomic % with respect to said total sum.

16. A process according to claim 15, wherein said sintering is carried out in an inert gas atmosphere.

17. A process according to claim 15, wherein said sintering is carried out in vacuum.

18. A process according to claim 15, wherein said sintered body is made into beta-$FeSi_2$.

19. A process according to claim 15, wherein said metallic powder is prepared by mechanical alloying.

20. A process according to claim 15 further comprising the step of, subsequent to said sintering, of carrying out a homogenizing heat treatment in vacuum.

* * * * *